United States Patent [19]

Sasaki et al.

[11] Patent Number: 4,937,790
[45] Date of Patent: Jun. 26, 1990

[54] SEMICONDUCTOR MEMORY DEVICE

[75] Inventors: Toshio Sasaki, Hachioji; Toshiaki Masuhara; Osamu Minato, both of Tokyo, all of Japan

[73] Assignees: Hitachi, Ltd., Tokyo; Hitachi Maxell, Ltd., Osaka, both of Japan

[21] Appl. No.: 227,893

[22] Filed: Aug. 3, 1988

[30] Foreign Application Priority Data

Aug. 31, 1987 [JP] Japan ................ 62-215384

[51] Int. Cl.$^5$ ............................. G11C 13/00
[52] U.S. Cl. ................. 365/230.01; 365/189.01; 365/200; 371/10.1; 371/21.1
[58] Field of Search .............. 365/189.01, 230.01, 365/189.02, 189.03, 189.05, 230.02, 230.06; 371/10, 21

[56] References Cited

U.S. PATENT DOCUMENTS 4,745,582  5/1988  Fukushi et al. .............. 365/200
4,817,056  3/1989  Furutani et al. .............. 365/200

OTHER PUBLICATIONS

ISCC Digest of Technical Papers, Feb. 1981, pp. 80–81, "Memories and Redundancy Techniques", Kokkonen et al.
IEEE Journal of Solid State Circuits, vol. S–15, No. 4, Aug. 1980, pp. 672–686, "A 1-Mbit Full Wafer MOS Ram", Egawa et al.

*Primary Examiner*—Terrell W. Fears
*Attorney, Agent, or Firm*—Antonelli, Terry, Stout & Kraus

[57] ABSTRACT

A semiconductor memory device is disclosed, in which a word line address translation unit, a data line address translation unit, a first spare memory and a second spare memory are provided in addition to a main memory to relieve a defective memory cell in the main memory. Spare word line address signals for selecting a spare word line on the first spare memory are written in the word line address translation unit, spare data line address signals for selecting a spare data line on the second spare memory are written in the data line address translation unit, and each of the word line address translation unit and the data line address translation unit is constructed of an ordinary semiconductor memory of the multi-bit output type.

6 Claims, 9 Drawing Sheets

| MODL | 115 | 117 | 118 | 401 | 402 | 403 |
|---|---|---|---|---|---|---|
| NORMAL | O | O | O | O | O | O |
| WORD LINE DEFECT RELIEF | 1 | O | 1 | 1 | O | O |
| DATA LINE DEFECT RELIEF | O | 1 | 1 | O | 1 | O |
| BIT-TYPE DEFECT RELIEF | 1 | 1 | 1 | O | O | 1 |

DEFECT DETECTION SIGNAL — SPARE MEMORY SELECTION SIGNAL

FIG. 10

SEMICONDUCTOR MEMORY DEVICE

BACKGROUND OF THE INVENTION

The present invention relates to a semiconductor memory device, and more particularly to a semiconductor memory device suited to form memory means having a very large capacity.

Figure 10:
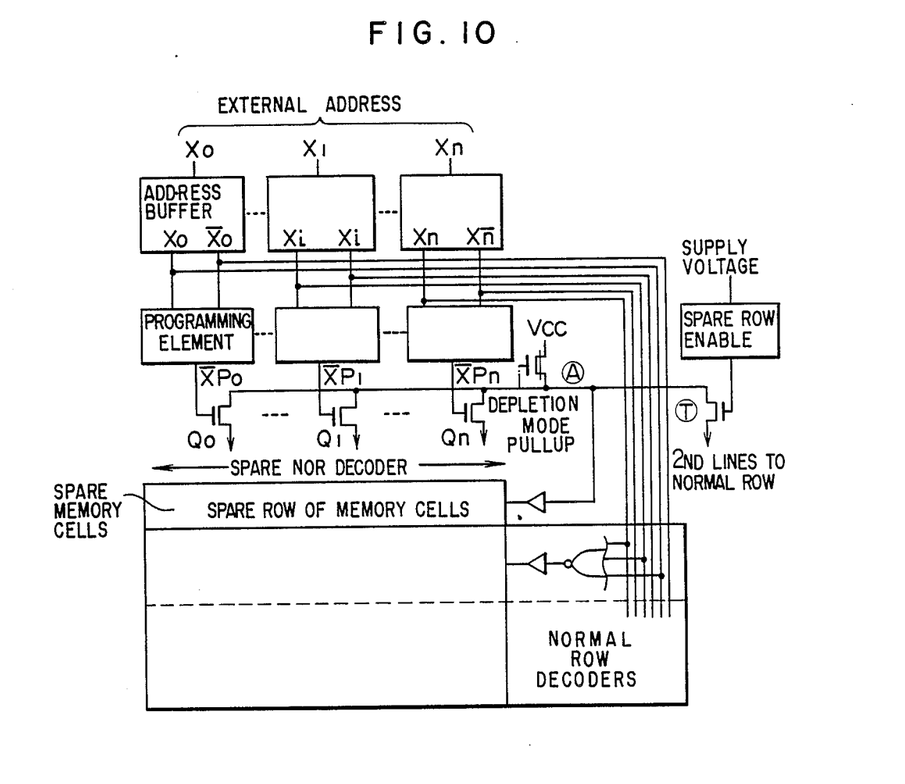
FIG. 10 is a block diagram for explaining the operation of a conventional semiconductor memory device.

The error correction technology used in conventional semiconductor memory devices will first be explained, to facilitate the understanding of the fundamental function of a semiconductor memory device according to the present invention. A first example of the conventional error correction technology is described in the February 1981 issue of the ISSCC DIGEST OF TECHNICAL PAPERS pages 80 and 81. In this example, as shown in FIG. 10, an external address is compared, on a semiconductor chip, with a defective address written in internal programming elements to select spare memory cells. In more detail, the programming elements are constructed so that transistors $Q_o$ to $Q_n$ included in a decoder are all put in an OFF-state in response to specific external address signals $X_o$ to $X_n$, and thus a node A is put to a high level in response to the specific external address signal $X_o$ to $X_n$, to select spare memory cells.

A second example is a redundance method carried out for individual memory blocks on a semiconductor wafer, and is described in the IEEE, Journal of Solid State Circuits, Vol. S-15, No. 4, August 1980, pages 677 through 686.

This method employs an external controller. In a case where defects are present in one of individual memory blocks, the defective memory block is changed over to a normal memory block with the aid of the external controller. That is, external means for processing the defective memory block is required.

A third example is a redundance method proposed in Japanese patent application Post-Examination Publication Nos. 46-25,767 and 47-6,534. In this method, the address of a defective bit is stored in an associative memory, and it is ascertained that an external address coincides with the defective bit address stored in the memory, to inform a spare memory of a new address, thereby reading out a normal bit.

SUMMARY OF THE INVENTION

A drawback common to the first to third examples of the conventional error correction technology resides in that the number of usable spare memory cells is limited. For example, in the first example, about 10 defective bits can be relieved at most. Thus, a memory which fails to relieve defective bits, or a memory having unrelievable defective bits has to be abandoned. In order to increase the number of relievable bits, it is required to make a redundance circuit large in scale, and thus the yield of a semiconductor memory device is reduced.

In the second example, there arises a problem that the whole of one memory block is relieved, and thus a large number of memory cells are used for relieving one defective memory block. Accordingly, a ratio of the area of spare memory cells to the area of a wafer is increased. In more detail, a defect relief method for relieving one memory block is complicated in process, and the external controller used is complicated in structure. Accordingly, it is difficult to put the second example to practical use. Further, even a memory block having only one defective memory cell is changed over to a normal memory block. Accordingly, a large number of spare memory cells are required for one relief operation.

A problem of the third example is to use an associative memory as an address translation device. That is, each cell of the associative memory is made up of 8 to 10 transistors, and a large number of logical operations are performed in a peripheral circuit of a semiconductor memory device. Such an associative memory is expensive, and hence a memory device using the associative memory becomes high in cost. Further, the associative memory is so constructed as to store the address of a defective bit, to ascertain that an external address coincides with the address of the defective bit, and to deliver a new address on a spare memory. Accordingly, it is hard for the associative memory to conform to the increase of the number of relievable defective bits.

It is therefore a principal object of the present invention to provide a semiconductor memory device, in which a defective bit is relieved by a relatively simple method, and the hardware for relieving a defective bit is relatively simple in structure.

In order to attain the above object, according to an aspect of the present invention, there is provided a semiconductor memory device which includes first and second spare memories 9, 10, a word line address translation unit 7 and a data line address translation unit 8 in addition to a main memory 1, to relieve a defective bit namely, defective memory cell on the main memory.

As is well known, the main memory 1 includes a plurality of memory cells, and one of the memory cells is selected in accordance with word line address signals 111 and data line address signals 110.

Figure 1:
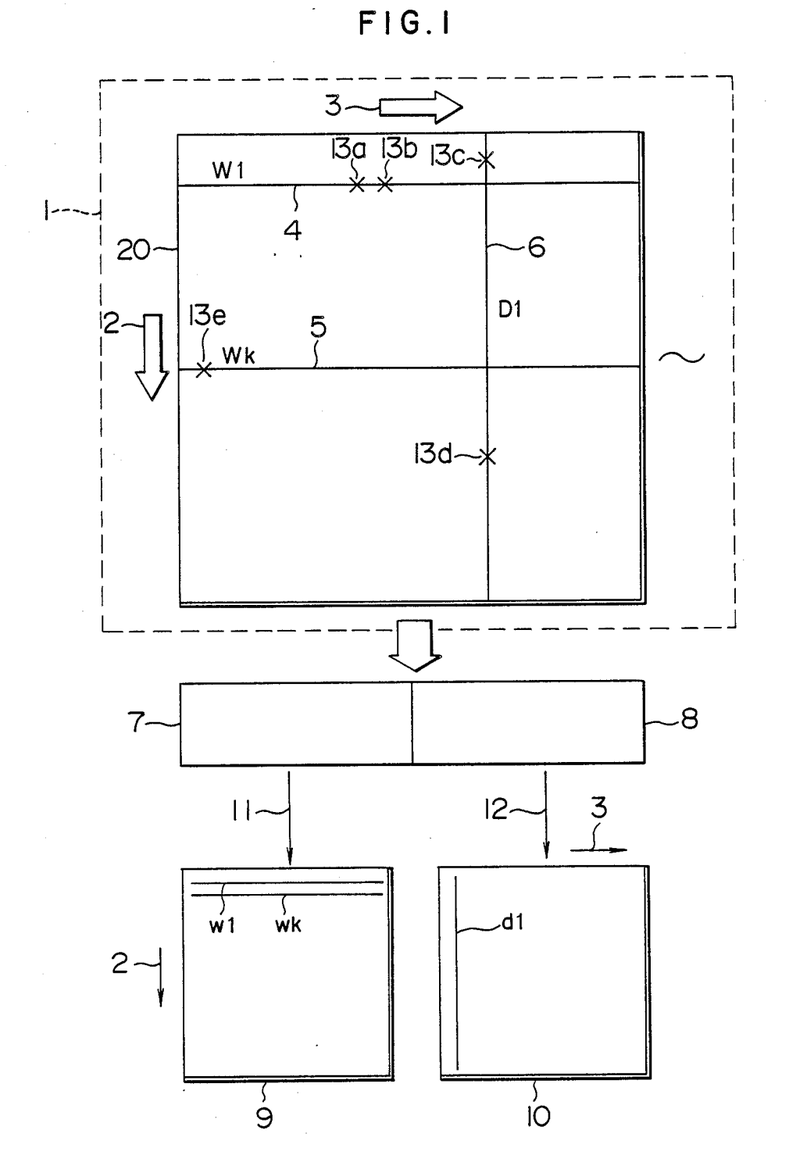
FIG. 1 is a block diagram for explaining the principle of a semiconductor memory device according to the present invention.
Figure 2:
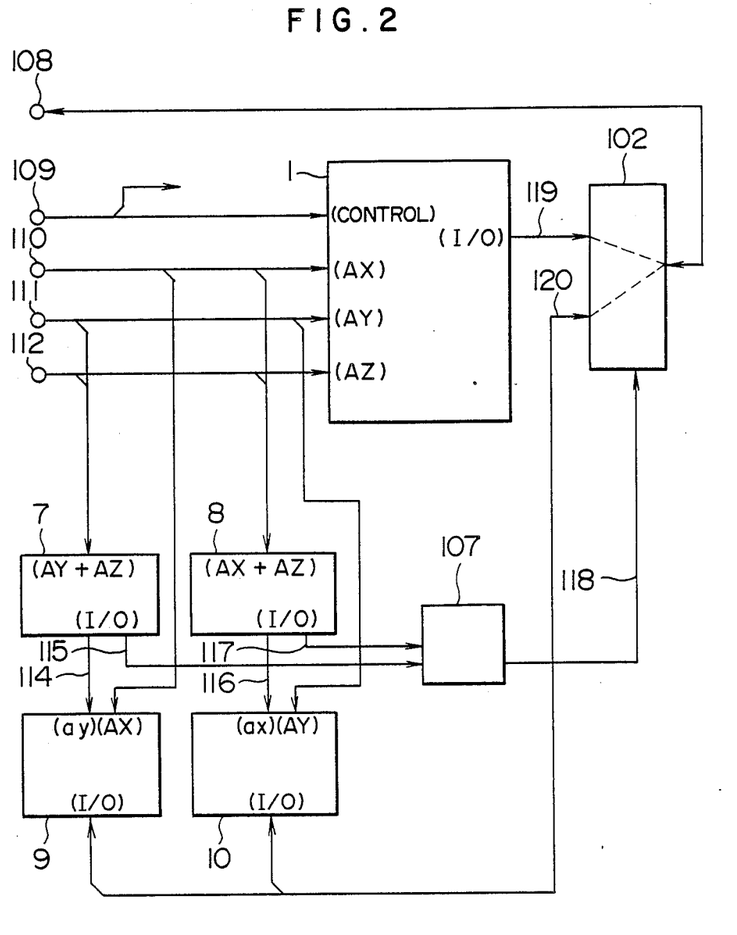
FIG. 2 is a block diagram showing an embodiment of a semiconductor memory device according to the present invention.

Referring to FIGS. 1 and 2, the word line address signals 111 are also applied to the input side of the word line address translation unit 7, and the data line address signals 110 are also applied to the data line address translation unit 8. When a word line Wl(4) which includes defects (namely, faulty portions) on the main memory 1 is selected by the word line address signals 111, a word line fault detection signal 115 indicative of the presence of the defects relating to the word line Wl is delivered from a second output portion of the word line address translation unit 7. Similarly, when a data line Dl (6) which includes defects (namely, faulty portions) on the memory 1 is selected by the data line address signals 110, a data line fault detection signal 117 indicative of the presence of the defects relating to the data line Dl is delivered from a second output portion of the data line address translation unit 8. At the same time as the word line fault detection signal 115 is delivered from the second output portion of the word line address translation unit 7, spare word line address signals 114 for selecting a spare word line (wl) on the first spare memory 9 are delivered from a first output portion of the word line address translation unit 7. Similarly, at the same time as the data line fault detection signal 117 is delivered from the second output portion of the data line address translation unit 8, spare data line address signals 116 for selecting a spare data line (dl) on the second spare memory 10 are delivered from a first output portion of the data line address translation unit 8. A first input portion of the first spare memory 9 responds to the spare word line address signals 114, and a second input portion of the first spare memory 9 responds to the data line address signals 110. Similarly, a first input portion of the second spare memory 10 responds to the spare data line address signals 116, and a second input portion of the second spare memory 10 responds to the word line address signals 111.

The first spare memory 9 includes a plurality of spare memory cells. In a case where the word line fault detection signal 115 is delivered from the second output portion of the word line address translation unit 7, one of the spare memory cells included in the first spare memory 9 is selected in accordance with the spare word line address signals 114 and the data line address signals 110, to relieve a defect relating to a word line on the main memory 1 by the first spare memory 9.

Like the first spare memory 9, the second spare memory 10 includes a plurality of spare memory cells. In a case where the data line fault detection signal 117 is delivered from the second output portion of the data line address translation unit 8, one of the spare memory cells included in the second spare memory 10 is selected in accordance with the spare data line address signals 116 and the word line address signals 111, to relieve a defect relating to a data line on the main memory 1 by the second spare memory 10.

The word line address translation unit 7 for generating the spare word line address signals 114 and the word line fault detection signal 115 in response to the word line address signals 111 can be constructed of an ordinary semiconductor memory of the multi-bit output type, for example, one of non-volatile semiconductor memories such as an EPROM (namely, electrically programmable read only memory), an EEPROM (namely, electrically erasable and programmable read only memory) and a fuse ROM (namely, fuse read only memory), or a battery backuped semiconductor memory such as a battery backuped SRAM (namely, battery backuped static random access memory). That is, the word line address translation unit 7 does not include any associative memory. Similarly, the data line address translation unit 8 for generating the spare data line address signals 116 and the data line fault detection signal 117 in response to the data line address signals 110 can be constructed or an ordinary semiconductor memory of the multi-bit output type, for example, one of non-volatile semiconductor memories such as an EPROM, an EEPROM and a fuse ROM, or a battery backuped semiconductor memory such as a battery backuped RAM. That is, the data line address translation unit 8 includes no associative memory. Thus, according to the present invention, a defect on a main memory can be relieved in a relatively simple manner, and moreover hardware used is relatively simple in construction as shown in FIGS. 1 and 2.

Other objects and novel features of the present invention will become apparent from the following detailed description taken in conjunction with the accompanying drawings.

DESCRIPTION OF THE PREFERRED EMBODIMENTS

Now, embodiments of a semiconductor memory device according to the present invention will be explained below, with reference to the drawings.

FIG. 1 is a block diagram for explaining the principle of a semiconductor memory device according to the present invention. In FIG. 1, reference numeral 20 designates a memory block chip for storing information therein, 1 a main memory made up of at least one memory block chip, 7 and 8 address translation units, 9 and 10 spare memories, 2 a data line address direction, 3 a word line address direction, and 11 and 12 spare address signals applied respectively to the spare memories 9 and 10.

Next, explanation will be made of the operation of the semiconductor memory device of FIG. 1. It is to be noted that each of word lines Wl and Wk (that is, word lines 4 and 5) has one or more word line direction faults, and a data line Dl (that is, data line 6) has data line direction faults. In more detail, two memory cells 13a and 13b arranged on the block chip 20 and relating to the word line Wl (that is, word line 4) are defective bits as shown in FIG. 1. Accordingly, the defective bits 13a and 13b are defined as word line direction faults, and are relieved by two spare memory cells relating to a spare word line Wl on the spare memory 9. Further, two memory cells 13c and 13d relating to the data line Dl are defective bits. Accordingly, the defective bits 13c and 13d are defined as data line direction faults, and are relieved by two spare memory cells relating to a spare data line dl on the spare memory 10. A defective bit 13e is not defined as one of a word line direction fault and a data line direction fault, but is originally defined as a bit type fault. However, the defective bit 13e can be regarded as a word line direction fault for convenience' sake, and is relieved by a spare memory cell relating to a spare word line wk on the spare memory 9. Alternatively, the defective bit 13e may be regarded as a data line direction fault, to be relieved by a spare memory cell included in the spare memory 10.

A scanning operation for the block chip 20 in the main memory 1 is performed in a word line direction and a data line direction, to check whether each of memory cells on the block chip 20 is normal or not, and spare address signals and a fault detection signal are written in each of the address translation units 7 and 8 on the basis of the result of the above check operation, to relieve defective memory cells on the block chip 20. Such a defect relief method will be explained later in detail.

FIG. 2 is a block diagram showing an embodiment of a semiconductor memory device according to the present invention. In FIG. 2, reference numeral 1 designates a main memory made up of one or more memory block chips, 7 a word line address translation unit, 8 a data line address translation unit, 9 a spare memory for relieving a word line direction fault, 10 a spare memory for relieving a data line direction fault, 108 an input/output signal (namely, I/0 signal), 109 a control signal for controlling the present embodiment, 110 data line address signals AX, 111 word line address signals AY, 112 memory block selection signals AZ, 115 a word line fault detection signal delivered from the word line address translation unit 7, 117 a data line fault detection signal delivered from the data line address translation unit 8, 107 a priority/check circuit for determining which of a word line direction fault and a data line direction fault is given a priority in a case where these faults are simultaneously generated, and for checking whether defective address is present or not, and 102 an input/output changeover circuit for changing one of an I/0 signal 119 of the main memory 1 and an I/0 signal 120 of the spare memories 9 and 10 over to the other signal, to select one of the I/0 signals 119 are 120 in accordance with the output signal 118 of the priority/check circuit 107.

The main memory 1, the spare memories 9 and 10, and the address translation units 7 and 8 have been already explained in detail. Hence, a defect relief method, in which it is checked whether each of memory cells on the main memory 1 is normal or not, and spare address signals and a fault detection signal are written in one of the address translation units 7 and 8 on the basis of the result of the above check operation, will be explained below in detail, with reference to FIGS. 1 and 2.

When word line direction faults with respect to a word line W1 (that is, word line 4) are detected by performing a scanning operation for the main memory 1 in a word line direction, spare word line address signals 114 (that is, ay) for selecting a spare word line wl on the spare memory 9 and the word line fault detection signal 115 are written in the word line address translation unit 7 at a plurality of addresses which are determined by the word line address signals 111 (that is, Ay) and memory block selection signals 112 (that is, AZ) for selecting the defective word line 4 (that is, W1). Further, when data line direction faults with respect to a data line D1 (that is, data line 6) are detected by performing a scanning operation for the main memory 1 in a data line direction, spare data line address signals 116 (that is, ax) for selecting a spare data line dl on the spare memory 10 and the data line fault detection signal 117 are written in the data line address translation unit 8 at a plurality of address which are determined by the data line address signals 110 (that is, AX) and memory block selection signal 112 (that is, AZ) for selecting the defective data line 6 (that is, D1).

When the word line address signals 111 (that is, AY) and memory block selection signals 112 (that is, AZ) for selecting the defective word line 4 (that is, W1) are applied to the word line address translation unit 7, the spare word line address signals 114 (that is, ay) and the word line fault detection signal 115 are read out of those addresses in the word line address translation unit 7 which are determined by the signals AY and AZ, in such a manner that the read-out signals are delivered from a plurality of output bits. Thus, the spare word line wl on the spare memory 9 is selected in accordance with the spare word line address signals 114 (that is, ay), and then spare memory cells on the spare word line wl are selected in accordance with the data line address signals 110 (that is, AX), to relieve the word line direction faults with respect to the word line 4 (that is, W1).

When the data line address signals 110 (that is, AX) and memory block selection signals 112 (that is, AZ) for selecting the defective data line 6 (that is, D1) are applied to the data line address translation unit 8, the spare data line address signals 116 (that is, ax) and the data line fault detection signal 117 are read out of those addresses in the data line address translation unit 8 which are determined by the signals AX and AZ, in such a manner that the read-out signals are delivered from a plurality of output bits. Thus, the spare data line dl on the spare memory 10 is selected in accordance with the spare data line address signals 116 (that is, ax), and then spare memory cells on the spare data line dl are selected in accordance with the word line address signals 111 (that is, AY), to relieve the data line direction faults with respect to the data line 6 (that is, D1).

Referring to FIG. 2, the input/output changeover circuit 102 normally selects the I/0 signal 119 of the main memory 1. When a fault on the main memory 1 is detected, the input/output changeover signal 118 from the priority/check circuit 107 applied with the fault detection signals 115 and 117 is activated, and thus the changeover circuit 108 selects the I/0 signal 120 of the spare memories 9 and 10. Incidentally, reference numeral 108 in FIG. 2 designates an I/0 terminal of the whole of the present embodiment. That is, digital information is written in memory cells on the main memory 1 or spare memory 9 or 10 through the terminal 108, and is read out of memory cells on the main memory 1 or spare memory 9 or 10 through the terminal 108.

Figure 3:
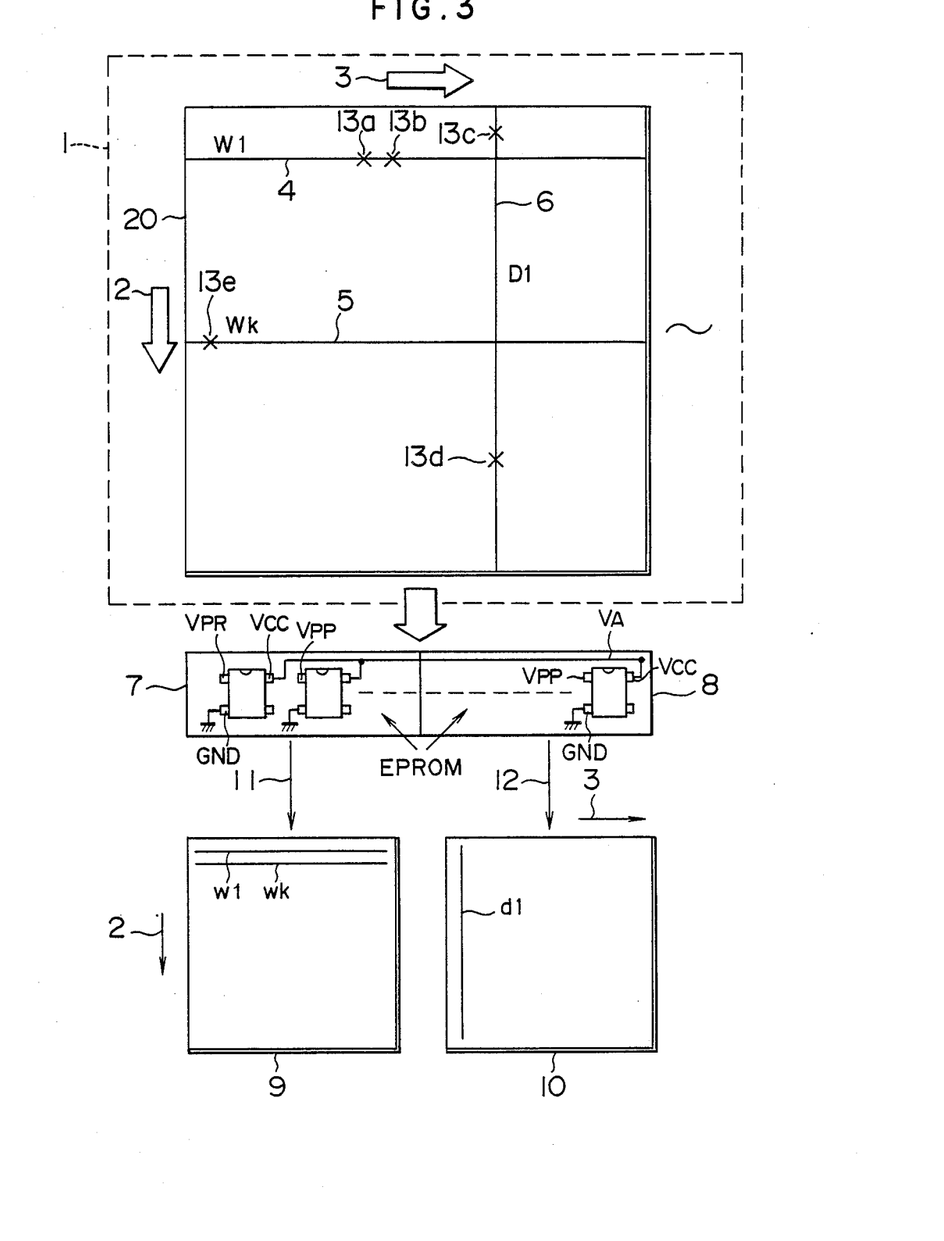
FIG. 3 is a block diagram showing the embodiment of FIG. 2 in a case where each address translation unit is constructed of an EPROM.
Figure 4:
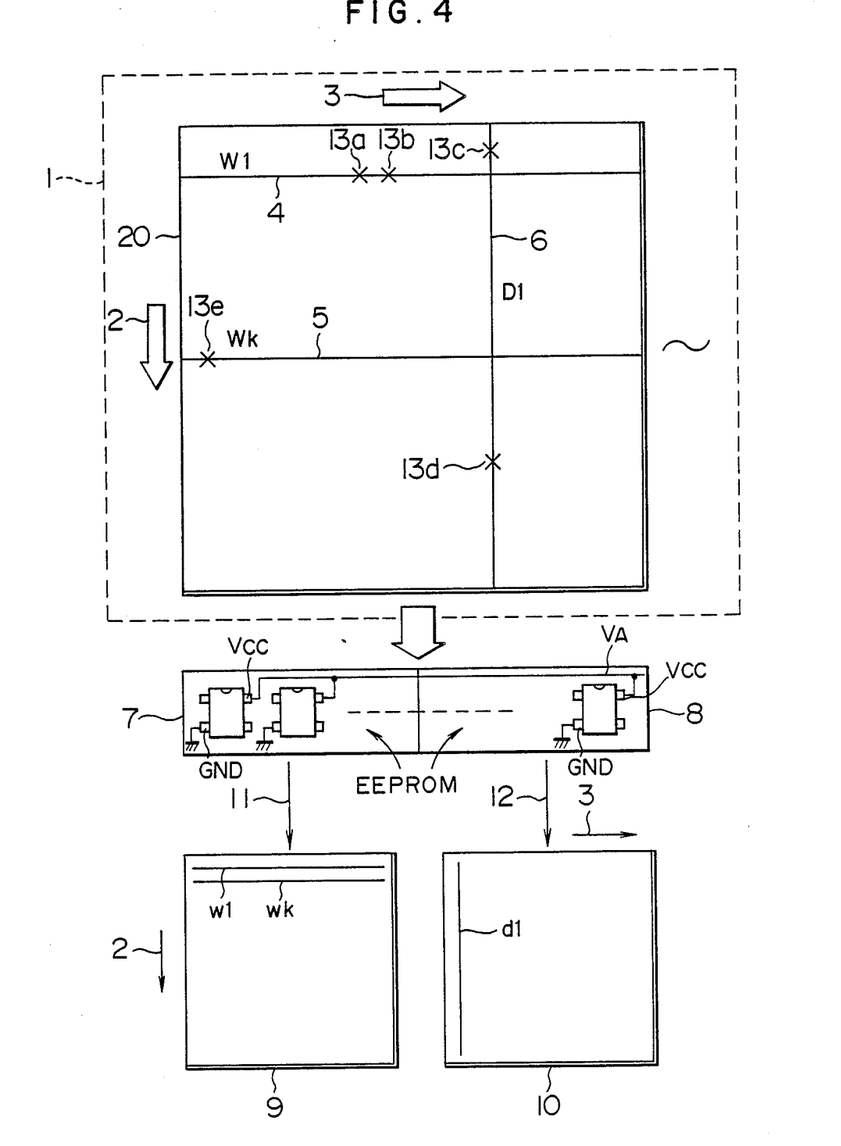
FIG. 4 is a block diagram showing the embodiment of FIG. 2 in a case where each address translation unit is constructed of an EEPROM.
Figure 5:
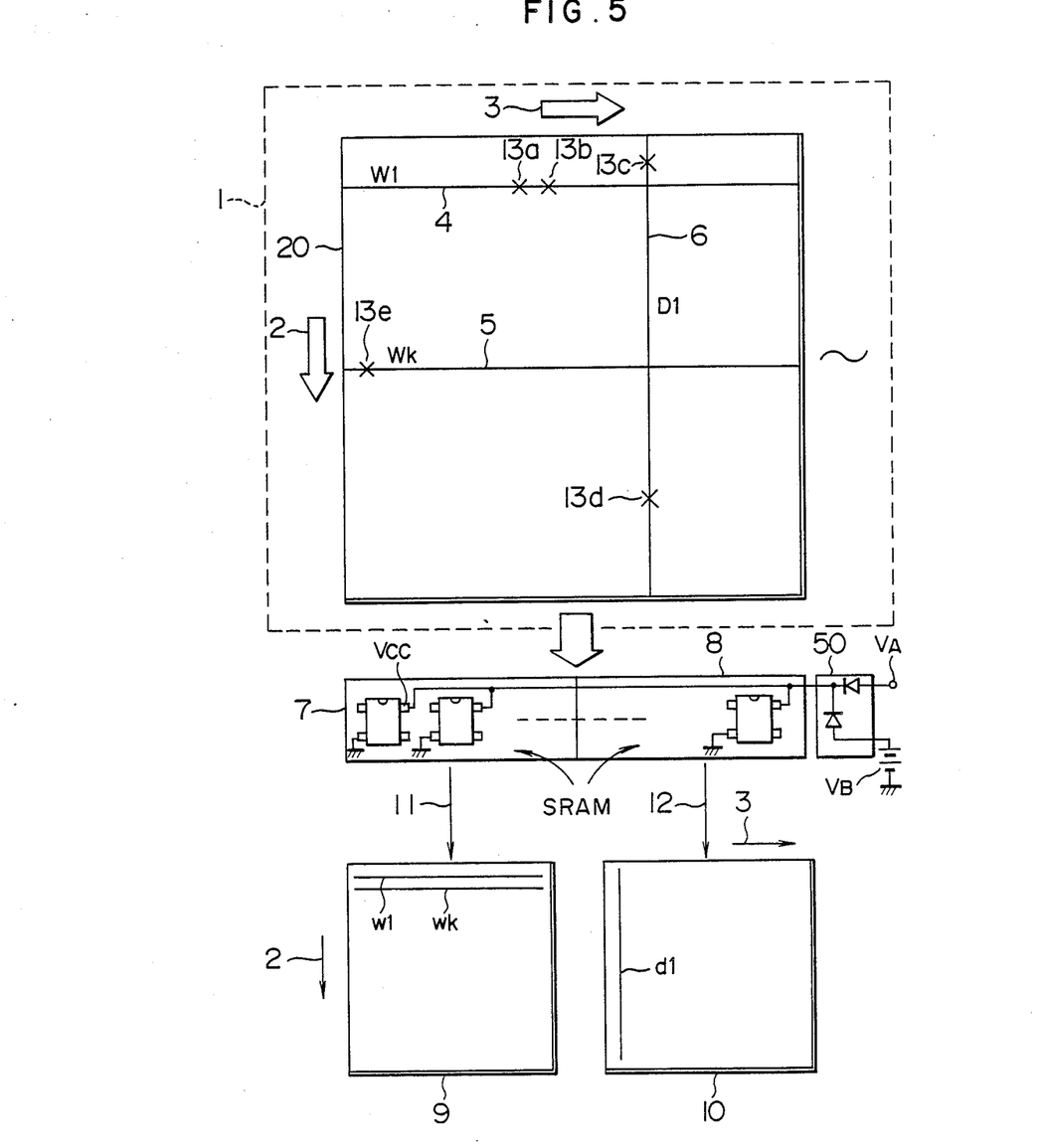
FIG. 5 is a block diagram showing the embodiment of FIG. 2 in a case where each address translation unit is constructed of a battery backuped SRAM.

FIG. 3 shows a case where each of the address translation units 7 and 8 is constructed of an EPROM capable of writing information therein electrically and erasing information therefrom by ultraviolet rays. FIG. 4 shows a case where each of the address translation units 7 and 8 is constructed of an EEPROM capable of electrically writing information therein and electrically erasing information therefrom. FIG. 5 shows a case where each of the address translation units 7 and 8 is constructed of a battery backuped SRAM. Referring to FIG. 5, when the SRAM is disconnected from a power supply $V_A$, a changeover circuit 50 supplies a battery voltage $V_B$ to the SRAM, and thus the spare address signals 114 and 116 and fault detection signals 115 and 117 stored in the SRAM are prevented from vanishing. Further, each of the address translation units 7 and 8 may be constructed of a non-volatile memory such as a fuse ROM.

Figure 6:
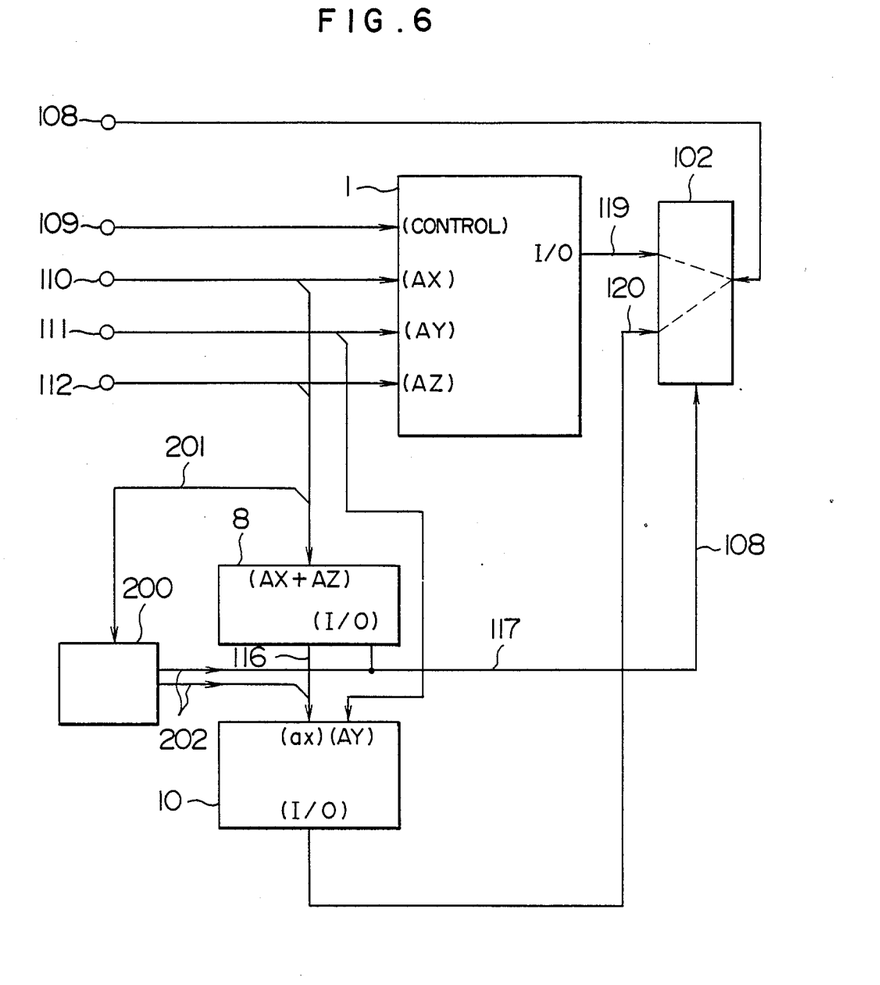
FIGS. 6 to 8 are block diagrams showing other embodiments of a semiconductor memory device according to the present invention.

FIG. 6 shows another embodiment of a semiconductor memory device according to the present invention. The embodiment of FIG. 6 is identical with the embodiment of FIG. 2, except that a latch circuit 200 is added to the data line address translation unit 8. As shown in FIG. 6, an input line 201 to the latch circuit 200 is supplied with the data line address signals 110 (that is, AX) and the memory block selection signals 112 (that is, AZ), and output lines 202 from the latch circuit 200 are connected to I/0 lines 116 and 117 of the data line address translation unit 8. By using the latch circuit 200, the spare data line address signals 116 and the data line fault detection signal 117 can be readily written in the data line address translation unit 8. In more detail, the spare data line address signals 116 and the data line fault detection signal 117 which are determined on the basis of the result of a check operation for the main memory 1, are latched by the latch circuit 200 through the input line 201, and then can be fetched from the latch circuit 200 into the data line address translation unit 8 through the output lines 202, to be written in the address translation unit 8 at a plurality of addresses which are determined by the data line address signals 110 (that is, AX) and the memory block selection signals 112 (that is, AZ). The latch circuit 200 is so controlled as to be inoperative for any other operation than the above write operation.

It is needless to say that a latch circuit similar to the above latch circuit may be added to the word line address translation unit 7, to perform a latch operation similar to the above-mentioned.

Figure 7:
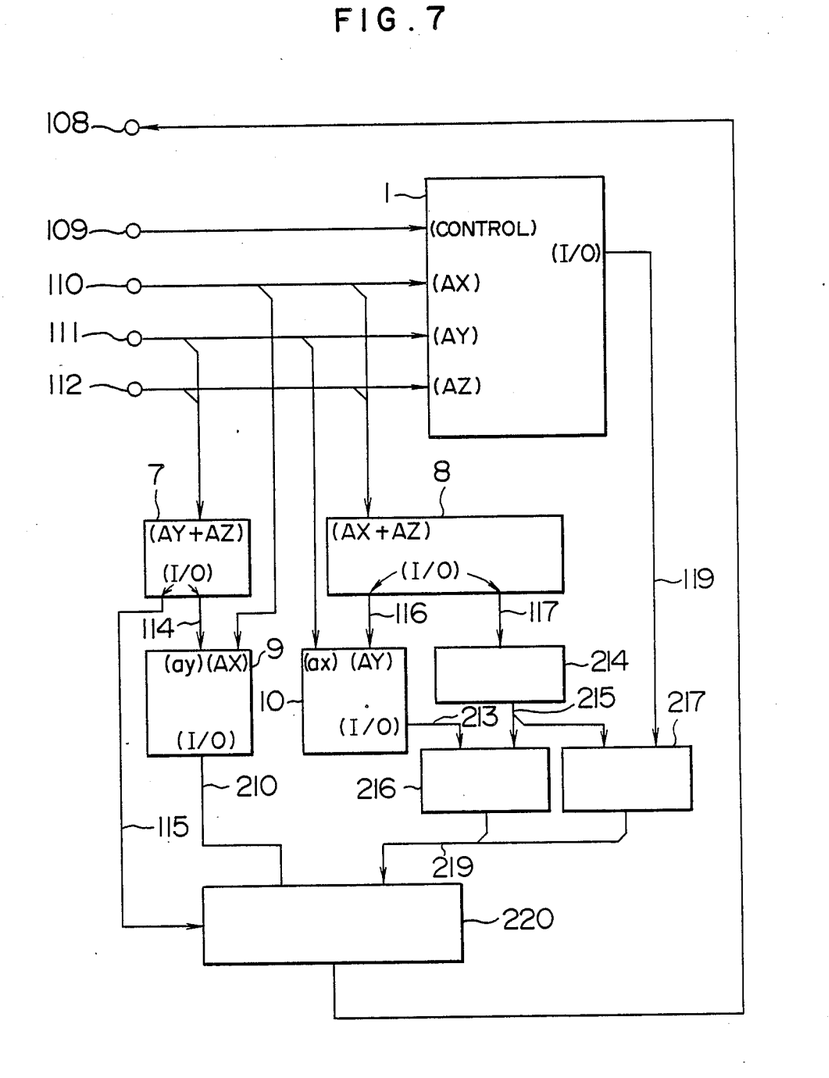

FIG. 7 shows a further embodiment of a semiconductor memory device according to the present invention. The embodiment of FIG. 7 is different from that of FIG. 2 in the following points. That is, the data line fault detection signal 117 delivered from the data line address translation unit 8 is made up of a plurality of bits, a decoder circuit 214 is controlled by the data line fault detection signal 117 made up of plural bits, a switching circuit 216 controlled by a decoded output signal 215 of the decoder circuit 214 is used for selecting an I/O signal 213 of the spare memory 10, and another switching circuit 217 controlled by the decoded output signal 215 of the decoder circuit 214 is used for selecting an I/O signal 119 of the main memory 1. For example, in a case where an input/output in the present embodiment is formed of eight bits, the second and third bits of an input/output are allotted to the spare memory 10, and the first and fourth to eighth bits of the input/output are allotted to the main memory 1.

Figure 8:
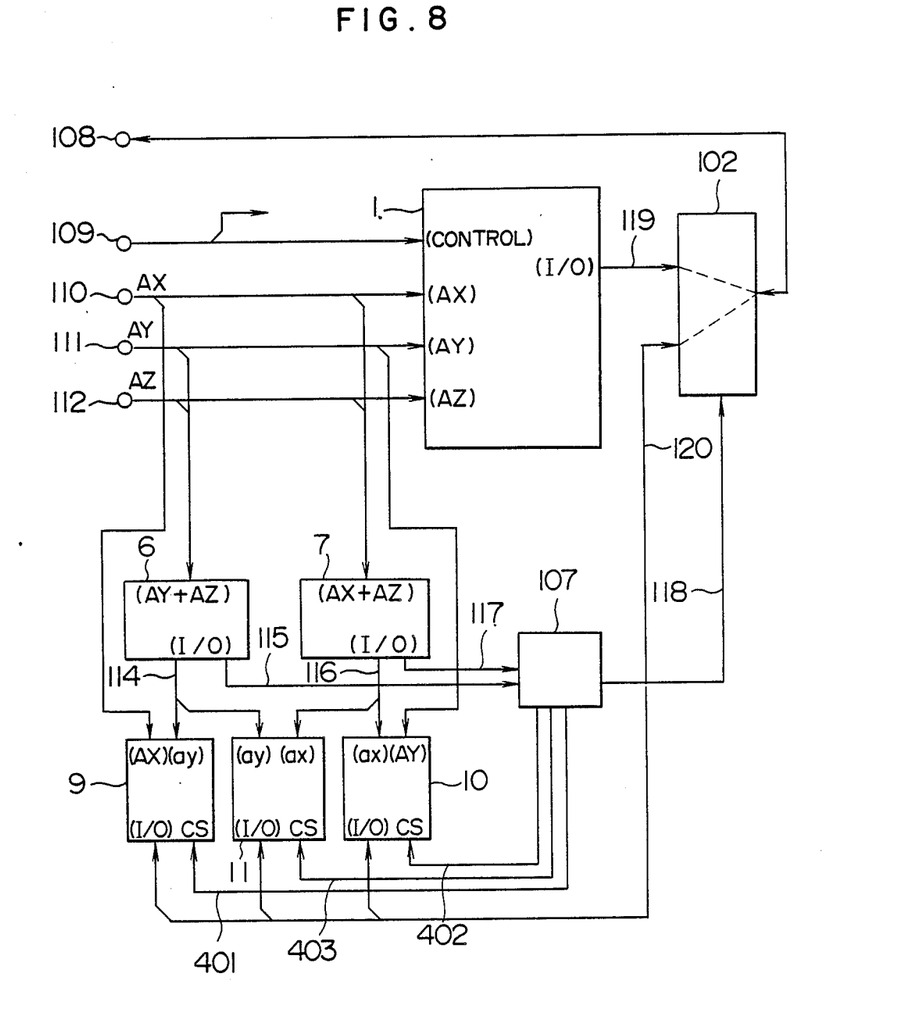
Figure 9:
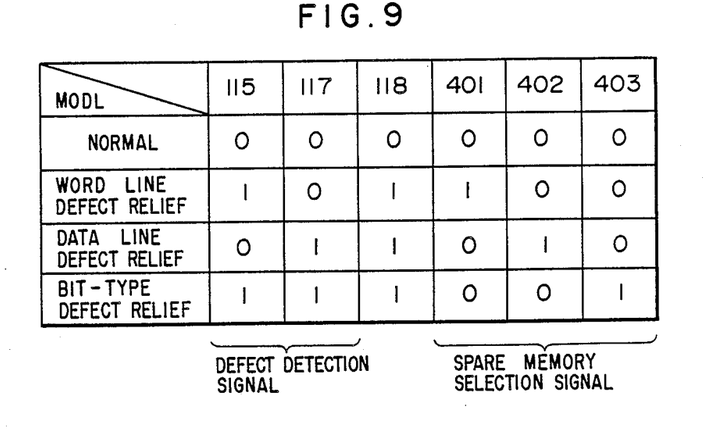
FIG. 9 shows a table for explaining the operation of the embodiment of FIG. 8.

FIG. 8 shows still another embodiment of a semiconductor memory device according to the present invention. The embodiment of FIG. 8 is different from the embodiment of FIG. 2 in that a third spare memory 11 is provided in addition to the spare memories 9 and 10, to relieve a memory cell which shows a bit type fault. According to the present embodiment, when a bit type fault is relieved, the word line fault detection signal 115 and the data line fault detection signal 117 are both put to a level "1" and a spare memory selection signal 403 is put to a level "1" as shown in FIG. 9, to select the third spare memory 11.

As has been explained in the foregoing, according to the present invention, there is provided a semiconductor memory device, in which each of the spare memories 9 and 10 for relieving faults on the main memory 1 can be constructed of an ordinary semiconductor memory of the multi-bit output type, a defective bit can be relieved by a relatively simple method, and hardware for carrying out the defect relief method is relatively simple in structure.

We claim:

1. A semiconductor memory device comprising:
   an I/O terminal;
   a main memory having a plurality of memory cells, one of the memory cells being selected in accordance with word line address signals and data line address signals;
   first and second spare memories for relieving a fault in the main memory;
   a word line address translation unit applied with the word line address signals for delivering spare word line address signals from a first output portion of the unit to the first spare memory, and for delivering a word line fault detection signal which indicates that a defective memory cell relating to the word line address signals is present in the main memory from a second output portion of the unit;
   a data line address translation unit applied with the data line address signals for delivering spare data line address signals from a first output portion of the unit to the second spare memory, and for delivering a data line fault detection signal which indicates that a defective memory cell relating to the data line address signals is present in the main memory from a second output portion of the unit;
   an input/output changeover circuit having a first terminal coupled with an input/output terminal of the main memory and a second terminal coupled to input/output terminals of the first and second spare memories and a third terminal coupled to the I/O terminal; and
   a control circuit having inputs which respond to the word line fault detection signal and the data line fault detection signal, and having an output which controls the input/output changeover circuit,
   wherein the data line address signals are applied to the first spare memory, together with the spare word line address signals,
   wherein the word line address signals are applied to the second spare memory, together with the spare data line address signals,
   wherein in a case where neither the word line fault detection signal and the data line fault detection signal is delivered from either of the second output portions of the word line address translation unit and of the data line address translation unit, the output of the control circuit controls the input/output changeover circuit so as to form a signal transmission path between the I/O terminal and the input/output terminal of the main memory, and wherein at least one of the plurality of memory cells of the main memory is selected in accordance with the word line address signals and the data line address signals,
   wherein in a case where the word line fault detection signal is delivered from the second output portion of the word line address translation unit, the output of the control circuit controls the input/output changeover circuit so as to form a signal transmission path between the I/O terminal and the input/output terminal of the first spare memory, and wherein at least one of a plurality of spare memory cells of the first spare memory is selected in accordance with the spare word line address signals and the data line address signals, to relieve a fault relating to a word line in the main memory, and
   wherein in a case where the data line fault detection signal is delivered from the second output portion of the data line address translation unit, the output of the control circuit controls the input/output changeover circuit so as to form a signal transmission path between the I/O terminal and the input/output terminal of the second spare memory, and wherein at least one of a plurality of spare memory cells of the second spare memory is selected in accordance with the spare data line address signals and the word line address signals, to relieve a fault relating to a data line in the main memory.

2. A semiconductor memory device according to claim 1, wherein the spare word line address signals for selecting a spare word line on the first spare memory and the word line fault detection signal are written in the word line address translation unit at addresses which are determined by the word line address signals, and wherein the spare data line address signals for selecting a spare data line on the second spare memory and the data line fault detection signal are written in the data line address translation unit at addresses which are determined by the data line address signals.

3. A semiconductor memory device according to claim 1, wherein each of the word line address translation unit and the data line address translation unit is constructed of a semiconductor memory of the multi-bit output type.

4. A semiconductor memory device according to claim 2, wherein each of the word line address translation unit and the data line address translation unit is constructed of a semiconductor memory of the multi-bit output type.

5. A fault relief method using the semiconductor memory device claimed in claim 1, comprising the steps of:

writing the spare word line address signals for selecting a spare word line on the first spare memory and the word line fault detection signal in the word line address translation unit at a plurality of address determined by the word line address signals, and writing the spare data line address signals for selecting a spare data line on the second spare memory and the data line fault detection signal in the data line address translation unit at a plurality of addresses determined by the data line address signals; and selecting at least one of a plurality of spare memory cells of the first spare memory in accordance with the spare word line address signals and the data line address signals for a case where the word line fault detection signal is delivered from the second output portion of the word line address translation unit, to relieve a fault relating to a word line on the main memory, and selecting at least one of a plurality of spare memory cells of the second spare memory in accordance with the spare data line address signals and the word line address signals for a case where the data line fault detection signal is delivered from the second output portion of the data line address translation unit, to relieve a fault relating to a data line on the main memory.

6. A fault relief method according to claim 5, wherein each of the word line address translation unit and the data line address translation unit is constructed of a semiconductor memory of the multi-bit output type.

* * * * *